(12) United States Patent
Bajaj et al.

(10) Patent No.: US 8,987,140 B2
(45) Date of Patent: Mar. 24, 2015

(54) METHODS FOR ETCHING THROUGH-SILICON VIAS WITH TUNABLE PROFILE ANGLES

(75) Inventors: Puneet Bajaj, Mountain View, CA (US); Tong Liu, San Jose, CA (US); Khalid Mohiuddin Sirajuddin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 432 days.

(21) Appl. No.: 13/434,291

(22) Filed: Mar. 29, 2012

(65) Prior Publication Data

US 2012/0270404 A1 Oct. 25, 2012

Related U.S. Application Data

(60) Provisional application No. 61/478,733, filed on Apr. 25, 2011.

(51) Int. Cl.
| | | |
|---|---|---|
| H01L 21/311 | (2006.01) | |
| H01L 21/3065 | (2006.01) | |
| H01L 21/768 | (2006.01) | |

(52) U.S. Cl.
CPC .... *H01L 21/30655* (2013.01); *H01L 21/76898* (2013.01)
USPC .......................................... 438/700; 438/696

(58) Field of Classification Search
USPC .......... 257/774, 750, 751; 438/637, 638, 639, 438/640, 689, 965, 696, 700
See application file for complete search history.

(56) References Cited

U.S. PATENT DOCUMENTS

| | | | |
|---|---|---|---|
| 7,564,115 B2 | 7/2009 | Chen et al. | |
| 7,803,714 B2 | 9/2010 | Ramiah et al. | |
| 7,829,465 B2 | 11/2010 | Lai et al. | |
| 7,839,163 B2 | 11/2010 | Feng et al. | |
| 2008/0020585 A1* | 1/2008 | Shimizu et al. | 438/725 |
| 2009/0065907 A1 | 3/2009 | Haba et al. | |
| 2010/0055400 A1 | 3/2010 | Farr et al. | |

OTHER PUBLICATIONS

Puech et al., "DRIE for Through Silicon Via", www.emc3d.org, Alcatel Micro Machining Systems.
Tutunjyan et al., "Dry Etch Solutions for 3D Integration Technology". IMEC, Kapeidreef 75, 3001 Leuven, Belgium.
Abdolvand et al., "An advanced reactive ion etching process for very high aspect-ratio sub-micron wide trenches in silicon". ScienceDirect, Sensors and Actuators A 144 (2008) 109-116.

\* cited by examiner

*Primary Examiner* — Thanh Y Tran
(74) *Attorney, Agent, or Firm* — Patterson & Sheridan, LLP

(57) ABSTRACT

The present disclosure provides methods for etching through-silicon vias (TSVs) in a substrate. The method employs a cyclic polymer passivation layer deposition, depassivation process and plasma etching process. By alternating the duration performed in the plasma etching process and the polymer passivation deposition process during the TSVs formation process, a good sidewall profile and via depth control may be obtained.

17 Claims, 6 Drawing Sheets

METHODS FOR ETCHING THROUGH-SILICON VIAS WITH TUNABLE PROFILE ANGLES

CROSS REFERENCE TO RELATED APPLICATION

This application claims benefit of U.S. Provisional Patent Application No. 61/478,733, filed Apr. 25, 2011, which is incorporated by reference in its entirety.

BACKGROUND

1. Field

Embodiments of the invention generally relate to a method for etching through-silicon vias (TSVs) with tunable profile angles while maintaining desired etching rates.

2. Description of the Related Art

Deep recessed structure etching is one of the principal technologies currently being used to fabricate semiconductor and microstructure devices. Strict control of the etch profile is required for complex devices to perform satisfactorily. Obtaining a controlled sidewall profile, where the taper angle range is from about 85 degrees to about 90 degrees in combination with a smooth sidewall surface has proved a difficult task in many instances.

Through-silicon vias (TSVs) with a sidewall taper angle ranging from about 85 degrees to about 90 degrees are particularly useful in various electronic packaging applications. The TSVs enable the attachment of various components to each other, frequently in manners which enable electrical connection from device to device. Different designs of the devices may require different sidewall taper angles to facilitate the bonding/packaging process. Inaccurate control of the sidewall taper angles may cause difficulty for the following wiring and/or packaging process, thereby resulting in device failure or poor electrical performance.

Furthermore, etching process control for forming deep trenches or deep vias in a substrate is often challenging. Improper etching process parameter control may result in defects formed in the resultant vias. For example, improper control of RF power generated during the etching process may result in insufficient depth down to the bottom of the vias or render grass type defects on the bottom of the vias. Additionally, sidewall profile management is highly associated with the process parameters and chemical precursors utilized during the etching process. Improper chemistry or process parameter control may result in an irregular profile, such as overly large side scallop 106, striation, non-smoothing or other different types of the defects formed on the via 104 formed in the substrate 102, as shown in FIG. 1.

Therefore, there requires an improved method for etching and forming TSVs in a substrate with desired sidewall management and profile control.

SUMMARY

The present disclosure provides methods for etching through-silicon vias (TSVs) in a substrate. The method employs a cyclic polymer passivation layer deposition, depassivation process and plasma etching process. By alternating the duration performed in the plasma etching process and the polymer passivation deposition process during the TSVs formation process, a good sidewall profile, via taper angle and via depth control may be obtained. In one embodiment, the good sidewall profile and via depth may be controlled by managing a relatively low process pressure and relatively high RF bias power during the polymer passivation deposition process and the depassivation process so as to maintain a desired anisotropic etching process until a desired sidewall profile and via depth is reached.

In one embodiment, a method for forming TSVs in a substrate includes performing a first etching process on a substrate in a processing chamber to form vias in the substrate, forming a polymer passivation layer on sidewall and a bottom of the vias formed in the substrate by supplying a polymer passivation gas mixture into the processing chamber while maintaining a process pressure at less than 200 mTorr for a first predetermined time period, removing a portion of the polymer passivation layer formed on the bottom of the vias by a depassivation gas mixture supplied into the processing chamber, and performing a second etching process to continue etching the vias with the polymer passivation layer remaining on the sidewalls of the vias for a second predetermined time period.

In another embodiment, a method for forming TSVs in a substrate includes performing a first etching process on a substrate in a processing chamber to form vias in the substrate, performing a polymer passivation deposition process on sidewalls and a bottom of the vias formed in the substrate while maintaining a process pressure at less than 200 mTorr for a first predetermined time period, performing a depassivation process to remove the polymer passivation layer from the bottom of the vias while maintaining a bias power to the substrate greater than about 150 watts during the depassivation process, and performing a second etching process to continue etching the vias with the polymer passivation layer remaining on the sidewalls of the vias for a second predetermined time period until a desired depth of the vias is reached In one embodiment, a method for forming TSVs in a substrate includes supplying a first etching gas mixture into a processing chamber to partially form vias in a substrate disposed therein, wherein the process pressure within the processing chamber is maintained above 50 mTorr while partially forming the vias, supplying a polymer passivation gas mixture into the processing chamber to maintain the process pressure at less than about 200 mTorr until a polymer passivation layer with a desired thickness has formed in the vias, supplying a depassivation gas mixture into the processing chamber while maintaining a substrate bias power greater than about 150 watts until the polymer passivation layer formed on the bottom of the vias is removed, wherein the process pressure within the processing chamber is maintained between about 50 mTorr and about 150 mTorr while continuing to etch the vias, and supplying a second etching gas mixture into the processing chamber to continue etching the vias through the bottom exposed by the polymer passivation layer until the polymer passivation layer formed on the sidewalls of the vias are removed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides methods for etching through-silicon vias (TSVs) in a substrate. The method employs a protective cyclic polymer passivation deposition, depassivation process and plasma etching process. By alternating the duration of the plasma etching process and polymer passivation deposition process during the TSVs formation process, a good sidewall profile and via depth control may be obtained. In one embodiment, the good sidewall profile and via depth may be controlled by maintaining a relatively low process pressure and relatively high RF bias power during the polymer passivation deposition process so as to maintain a desired anisotropic etching process until a desired sidewall profile and via depth is reached.

Figure 2:
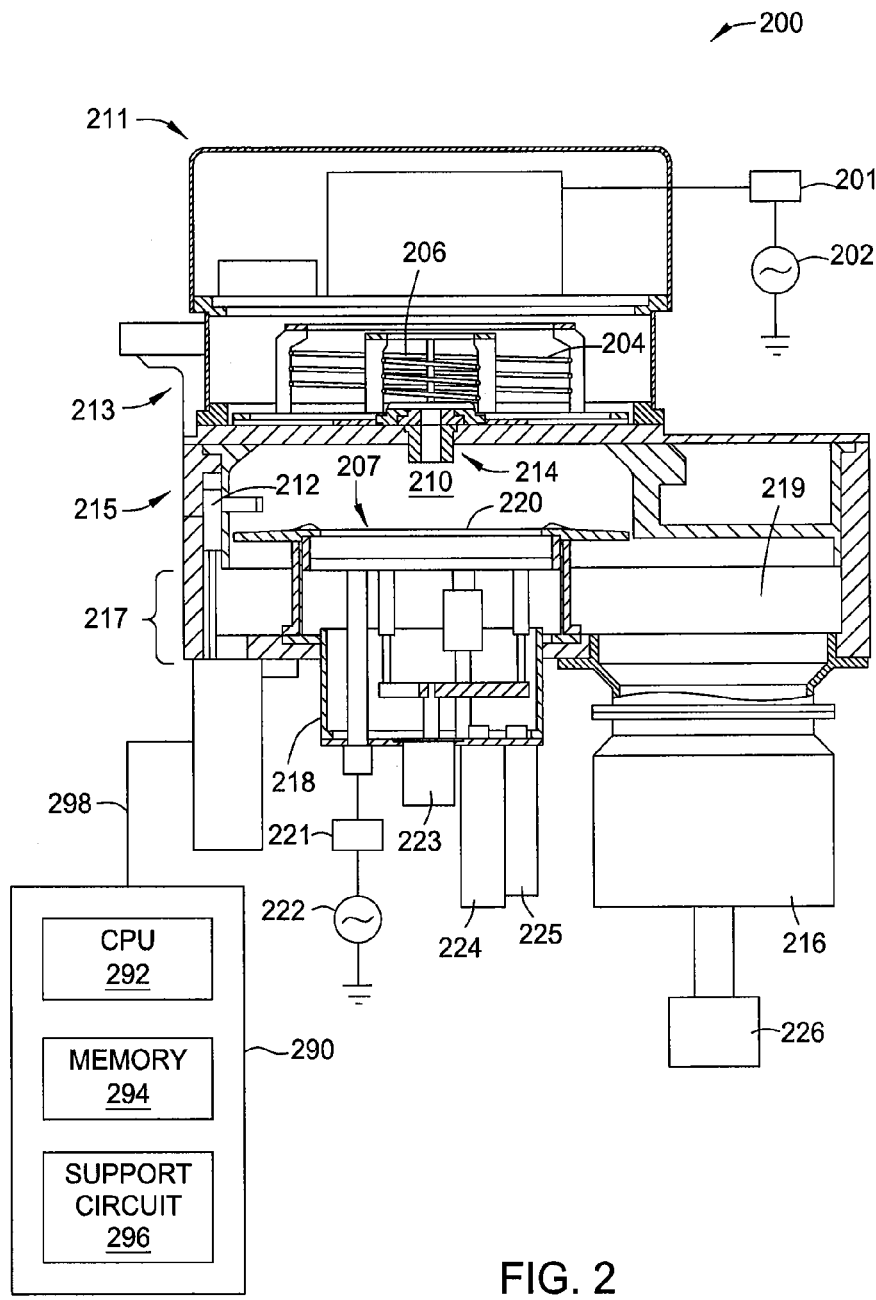
FIG. 2 illustrates a schematic isometric view of an apparatus that may be used in conjunction with embodiments of the present invention to perform a through-silicon via (TSV) etching process.

FIG. 2 depicts a schematic isometric view of a processing chamber 200 that may be used in conjunction with embodiments of the present invention to perform a TSV etching process. The TSV etching process may be practiced in a DPS II TSV processing chamber available from Applied Materials, Inc., Santa Clara, Calif. It is contemplated that the TSV process may be practiced in suitable processing chambers available from other manufactures. The DPS II TSV processing chamber may be used as part of an Integrated Processing System, also available from Applied Materials, where transfer between a combination of different processing chambers (which make up an Integrated Processing System) enables a variety of processing procedures without exposing the substrate to the ambient environment. An advantageous Integrated Processing System is the CENTURA® Mainframe System, which is also available from Applied Materials, Inc.

FIG. 2 depicts a cross sectional view of an exemplary processing chamber 200 in which the etching process further described below may be practiced. The processing chamber 200 is a fully automated semiconductor etch processing chamber of the kind which is typically employed as part of a multi-chamber, modular system (not shown) which may accommodates a variety of substrate sizes. The processing chamber 200 including a chamber body 215 having a processing volume 210 is configured to accommodate a substrate diameter size up to 12 inch (300 mm).

The processing chamber 200 includes a plasma source power 202 and a matching network 201 which are in communication with a power generating apparatus present within a first enclosure 211 disposed on the chamber body 215. The plasma source power 202 and matching network 201 operate at a frequency which is typically in the range of about 12 MHz to about 13.5 MHz (while this particular processing chamber operates at this frequency, other processing chambers which may be used operate at source power frequencies ranging up to 60 MHz), at a power in the range from 0.1 kW to about 5 kW. Inductive coils 204, 206 are located within a second enclosure 213 disposed between the chamber body 215 and the first enclosure 211. The inductive coils 204, 206 may generate an RF inductively coupled plasma in the processing volume to perform a plasma process on a substrate 220 disposed on a substrate support assembly 207 disposed in the chamber body 215. A processing source gas may be introduced into the processing volume 210 through a gas exchange nozzle 214 to provide uniform controlled gas flow distribution.

The processing chamber volume 210 present within the chamber body 215 is in communication with a lower processing chamber 217. The lower processing chamber 217 is in communication with a throttle valve 219 located above and in communication with a turbo pump 216, which is located above and in communication with a rough pump 226. In operation, plasma source gas is provided to processing volume 210 and processing by-products are pumped out of the processing volume 210 through the throttle valve 219, turbo pump 216 and rough pump 226. A substrate entry port 212 is formed in the chamber body 215 to facilitate entry and removal of the substrate 220 from the processing chamber 200.

The substrate support assembly 207 is disposed within the chamber body 215 to support the substrate 220 during processing. The substrate support assembly 207 may be a conventional mechanical or electrostatic chuck with at least a portion of the substrate support assembly 207 being electrically conductive and capable of serving as a process bias cathode. A cooling fluid supplying inlet 224 may be coupled to the substrate support assembly 207 configured to supplying cooling fluid to the substrate support assembly 207 to maintain the temperature thereof at a desired range. The substrate support assembly 207 is raised and lowered by means of a wafer lift 223 for processing.

The controller 290 includes a central processing unit (CPU) 292, a memory 294, and a support circuit 296 utilized to control the process sequence and regulate the gas flows and plasma process performed in the processing chamber 200. The CPU 292 may be of any form of a general purpose computer processor that may be used in an industrial setting. The software routines such as the etching process described below can be stored in the memory 294, such as random access memory, read only memory, floppy, or hard disk drive, or other form of digital storage. The support circuit 296 is conventionally coupled to the CPU 292 and may include cache, clock circuits, input/output systems, power supplies, and the like. Bi-directional communications between the controller 292 and the various components of the processing chamber 200 are handled through numerous signal cables collectively referred to as signal buses 298, some of which are illustrated in FIG. 2.

In one embodiment, the substrate 220 provided in the processing chamber 200 is biased by providing RF power from a RF bias power source 222 through a matching network 221 coupled to the substrate support assembly 207. RF power provided by the RF biased power source 222 may be within the range of 100 kHz to 13.56 MHz, such as within the range of 100 kHz to 2 MHz. The plasma source power 202 and the substrate bias power source 222 are independently controlled by the controller 290. In particular, the RF bias power source 222 is pulsed using a generator pulsing capability set by system controllers to provide a percentage of time that the power is on which is referred to as the "duty cycle." The time on and time off of a pulsed bias power is uniform throughout substrate processing. In this instance, for example, if the power is on for 3 msec and off for 15 msec, the "duty cycle"

would be 16.67%. The pulsing frequency in cycles per second (Hz) is equal to 1.0 divided by sum of the on and off time periods in seconds. For example, when the power is on for 3 msec and off for 15 msec, for a total of 18 msec, the pulsing frequency in cycles per second is 55.55 Hz. It would be possible to use a specialized pulsing profile where on/off timing changing during substrate processing for particular needs.

Figure 3:
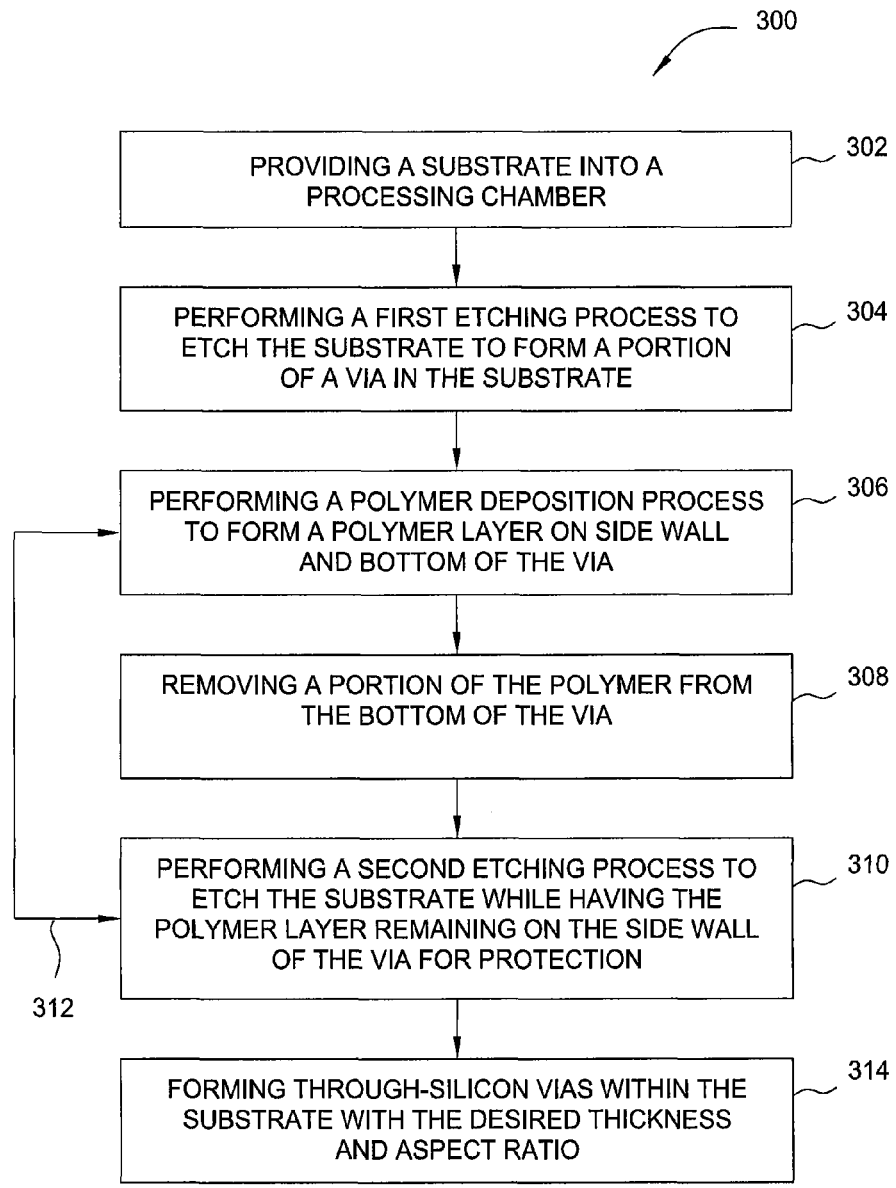
FIG. 3 illustrates a flow diagram of a method for etching TSVs in a substrate in accordance with one embodiment of the present invention.

FIG. 3 depicts a flow diagram of a method for etching TSVs in a substrate in a processing chamber, such as the processing chamber 200 depicted in FIG. 2 or other suitable processing chambers. The process 300 is described with reference to FIGS. 4A-4D. The process 300 starts at block 302 by providing a substrate, such as the substrate 220 depicted in FIG. 2, into the processing chamber 200. The substrate 220 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate may have various dimensions, such as 200 mm or 300 mm diameter wafers, as well as, rectangular or square panels.

Figure 4A:
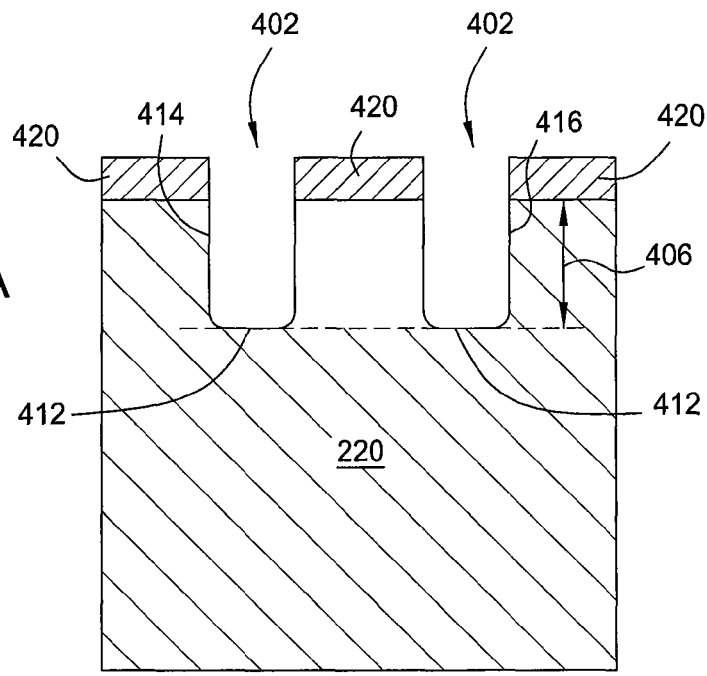
FIGS. 4A-4E illustrate schematic cross-sectional views of TSVs formed in a substrate during different stages of the method of FIG. 3.

At block 304, a first etching process is performed to etch the substrate 220 to form a portion of TSVs 402 exposed by a patterned mask 420 disposed on the substrate 220, as shown in FIG. 4A. The first etching process is performed to etch the substrate 220 to a predetermined depth 406 before unwanted defects, such as striation, overly large size scallops, or micrograss type defects, that may be possibly formed on sidewalls 414 or bottom 412 of the TSVs 402.

Figure 4B:
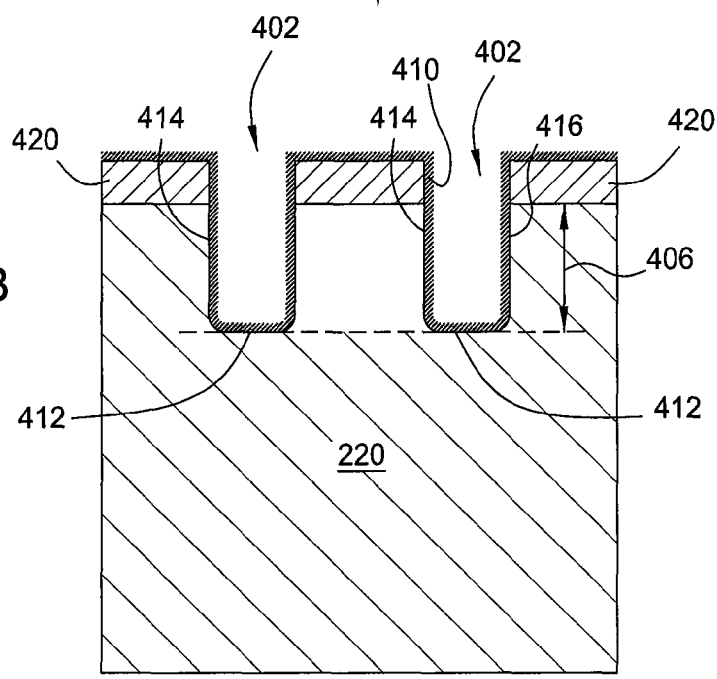

In one embodiment, the first etching process may be performed by supplying a first etching gas mixture into the processing chamber 200 to perform the substrate etching process. The first etching gas mixture includes at least one of $Cl_2$, HCl, HBr, $CF_4$, $CHF_3$, $NF_3$, $SF_6$, and the like. In one exemplary embodiment, the first etching gas mixture includes $SF_6$ gas. Several process parameters may also be regulated during the etching process. In one embodiment, the chamber pressure in the presence of the first etching gas mixture inside the etch chamber is regulated above 50 mTorr, such as between about 50 mTorr to about 500 mTorr, for example, at about 125 mTorr. A substrate bias power may be applied to the substrate support assembly at a power between about 0 and about 800 watts. RF source power may be applied to maintain a plasma between about 1000 watts to about 4500 watts to maintain the plasma inside the etch chamber. A substrate temperature is maintained within a temperature range of between about −50 degrees Celsius and about 100 degrees Celsius, such as between −20 degrees Celsius to about 40 degrees Celsius At block 306, a polymer passivation deposition process is performed to form a polymer passivation layer 410 on the substrate 220, as shown in FIG. 4B. The polymer passivation deposition process is performed by supplying a polymer passivation deposition gas mixture into the processing chamber 200. The polymer passivation layer 410 may be formed on the surface of the substrate 220, including sidewalls 414, a bottom 412 and the surface of the patterned mask layer 420 disposed on the substrate 220, as shown in FIG. 4B. The polymer passivation layer 410 formed on the sidewall 414 and the bottom 412 of the via is utilized to protect the via 402 from being overly etched during the through-silicon via formation process. Insufficient polymer passivation protection in the via 402 may result in aggressive etchants breaking through the polymer layer 410 in some locations and may cause secondary silicon etching, leading to striations. Accordingly, by depositing the polymer passivation layer 410 with sufficient and proper thickness, protection of the sidewalls 414 of the via 402 may be obtained.

During the polymer passivation deposition process, a relatively lower process pressure, such as lower than 200 mTorr, is applied so as to deposit the polymer passivation layer 410 in the vias 402 with good adhesion. It is believed that low process pressure can assist in uniform polymer deposition, producing good quality polymer film and lowering isotropic etching (sidewall etching) tendency, thereby enhancing the adhesion at the interface where the polymer passivation layer 410 is formed in the vias 402. Furthermore, low process pressure maintained during the polymer passivation deposition process may also assist in forming the polymer passivation layer 410 uniformly on the via sidewalls 414 and reduce sidewall etching tendency.

In one embodiment, the polymer passivation deposition process may be performed by supplying a polymer passivation deposition gas mixture into the processing chamber 200 to perform the polymer passivation deposition process. The polymer passivation deposition gas mixture includes a hydrocarbon gas, such as $C_4F_8$, $C_4F_6$, and the like. In one exemplary embodiment depicted herein, the polymer passivation deposition gas mixture includes $C_4F_8$ gas. Several process parameters may also be regulated during the etching process. In one embodiment, the chamber pressure in the presence of the polymer passivation deposition gas mixture is regulated between about 20 mTorr to about 200 mTorr, for example, at about 100 mTorr. RF source power may be applied to maintain a plasma between about 1000 watts to about 4500 watts to maintain the plasma inside the etch chamber. A substrate temperature is maintained within a temperature range of about −20 degrees Celsius to about 40 degrees Celsius. The polymer passivation deposition process may be performed between about 0.01 seconds and about 50 seconds, such as between about 0.3 seconds and about 2 seconds.

Figure 4C:
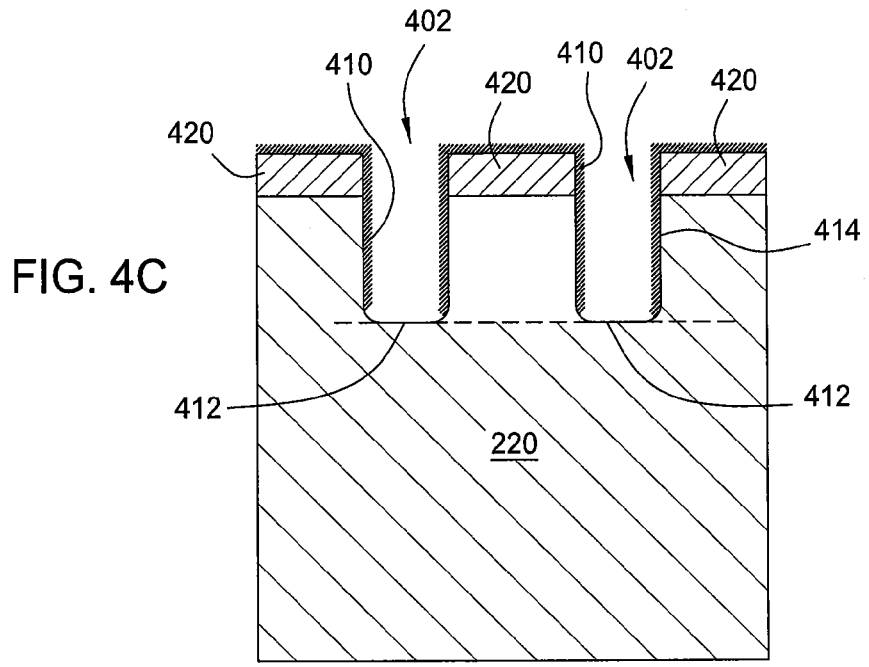

At block 308, a partial polymer passivation removal process (e.g., a depassivation process) is performed to remove a portion of the polymer passivation layer 410 from the bottom 412 of the substrate 220, as shown in FIG. 4C. The polymer passivation layer 410 is anisotropically removed from the bottom 412 of the via 402 by a depassivation gas mixture. The depassivation gas mixture includes a hydrocarbon gas, such as $C_2F_6$, $SF_6$, and the like, to mainly remove the polymer passivation layer 410 from the bottom 412 of the via 402 while maintaining sufficient thickness of the polymer passivation layer 410 on the sidewall 414 of the via 402. The removal of the polymer passivation layer 410 from the bottom 412 of the via 402 assists in reopening the bottom 412 of the via 402 to be further etched until a desired depth of the vias 402 is formed within the substrate 220 without attacking the polymer 410 disposed on the sidewalls 414 of the via 402. As ion flux may decay closer to the bottom 412 of the via 402, insufficient ion flux closer to the bottom 412 of the via 402 may eventually lead to stopping of the partial polymer removal process. Accordingly, increasing bias power to increase the ion flux down to the bottom of the via 402 may efficiently assist enhancing the deep via etching process. In contrast, overly high density of the ions formed within the via 402 may adversely attack the sidewall 414 of the via 402, thereby resulting in undesired defects and profile damage. Accordingly, the depassivation process is performed to mainly remove the polymer passivation layer 410 only partially from the bottom 412 of the via 402 while maintaining the sufficient polymer passivation layer 410 on the sidewall 414 of the via 402 to protect the sidewalls 414 from attacking during the subsequent etching process. Furthermore, a relatively higher bias power, such as greater than 150 Watts, is also utilized during the depassivation process so as to assist removing the polymer passivation layer 410 from the bottom 412 of the via 402 and promote anisotropic downward etching to reach down to the bottom 412 of the vias 402. Applying the bias power at a desired range during the depassivation process may efficiently assist removing the polymer passivation layer 410 mainly on the bottom 412 of the vias 402 so as to promote anisotropic etching process and assist etching high aspect ratio vias within the substrate 220.

In one embodiment, the depassivation gas mixture includes a hydrocarbon gas, such as $C_2F_6$, $SF_6$, and the like. In one exemplary embodiment, the depassivation gas mixture includes $C_2F_6$ gas. Several process parameters may also be regulated during the depassivation process. In one embodiment, the chamber pressure in the presence of the depassivation gas mixture is regulated between about 50 mTorr to about 150 mTorr, for example, at about 125 mTorr. A relatively higher substrate bias power, such as higher than 150 watts, for example higher than 200 watts, may be applied to the substrate support pedestal. In one embodiment, the substrate bias power may be applied at a power between about 150 watts and about 350 watts, such as between about 200 Watts and about 350 watts. An RF source power may be applied to maintain a plasma between about 1000 watts to about 4500 watts to maintain the plasma inside the etch chamber. A substrate temperature is maintained within a temperature range of between about −50 degrees Celsius and about 100 degrees Celsius, such as between about −20 degrees Celsius to about 40 degrees Celsius. The depassivation process may be performed between 0.01 seconds and about 100 seconds, such as between about 0.3 seconds and about 2 seconds.

Figure 1:
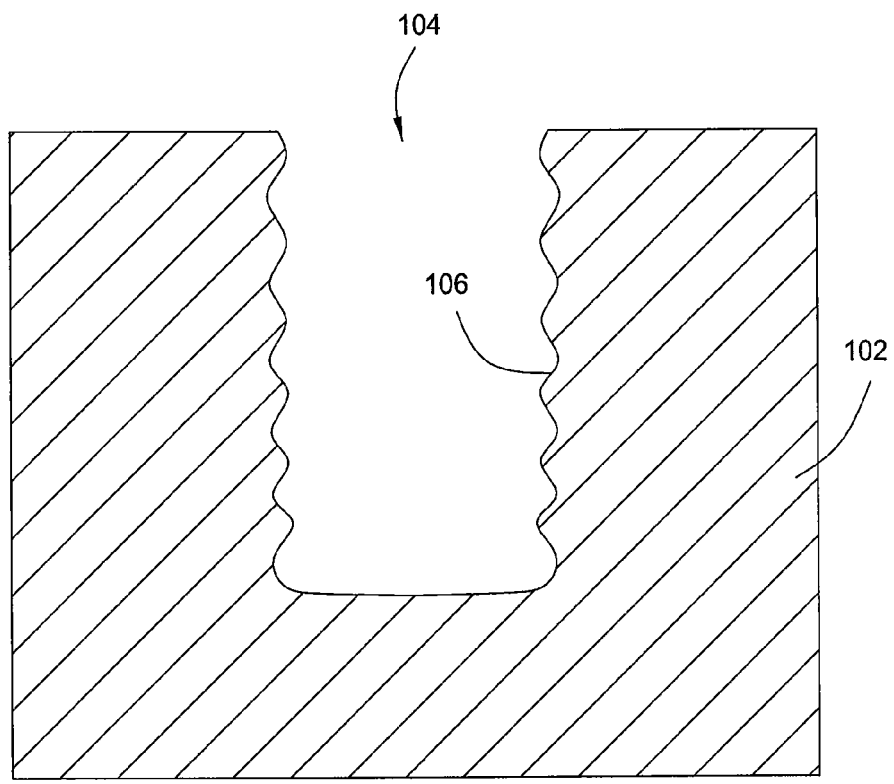
FIG. 1 illustrates schematic cross-sectional views of through silicon vias (TSVs) formed by a conventional etching process.
Figure 4D:
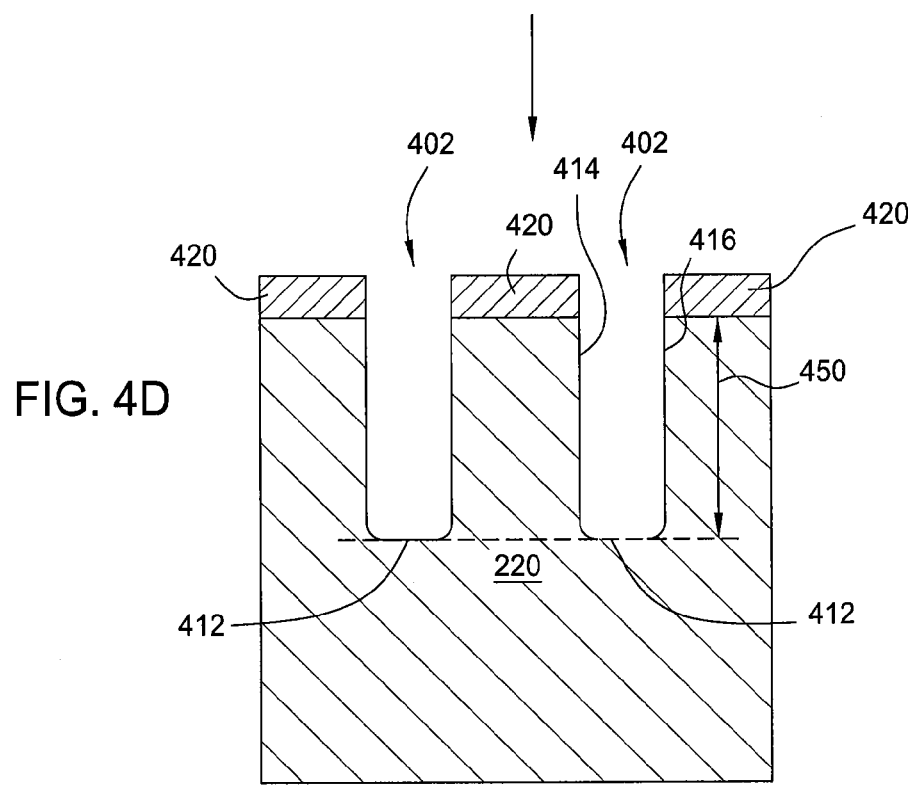

At block 310, a second etching process is performed to continue etching bottom 412 of the via 402 left unprotected by the polymer passivation layer 410 until a desired depth 450 is reached, as shown in FIG. 4D. During the second etching process, the via 402 is further etched through its bottom 412. The polymer passivation layer 410 formed on the sidewall 411 of the via 402 may be consumed during the second etching process. Thus, the second etching process may also be performed and terminated until the polymer passivation layer 410 is partially or entirely consumed and removed from the via 402. When the polymer passivation layer 410 is substantially consumed, a second cycle of polymer passivation deposition process, depassivation process, and the etching process performed from block 306 to block 310, may then be commenced and repeatedly performed, as shown by loop 312 shown in FIG. 3 to cyclically redeposit polymer passivation layer and incrementally etch the via 402 until a desired depth and via aspect ratio is formed within the substrate 220. Incremental etching with repetitive removal and redeposition of the polymer passivation layer 410 improves via verticality and profile control, while providing a smoother sidewall as compared to the conventional via illustrated in FIG. 1.

In one embodiment, the second etching process may be performed by supplying a second etching gas mixture into the processing chamber 200 to perform the substrate etching process. The second etching gas mixture includes at least one of $Cl_2$, HCl, HBr, $CF_4$, $CHF_3$, $NF_3$, $SF_6$, and the like. In one exemplary embodiment depicted here, the second etching gas mixture includes $SF_6$ gas. The second etching gas mixture may be substantially similar to the first gas mixture as these two etching processes are targeted to etch the same material within the substrate 220.

Several process parameters may also be regulated during the second etching process. In one embodiment, the chamber pressure in the presence of the second etching gas mixture inside the etch chamber is regulated between about 50 mTorr to about 170 mTorr, for example, at about 140 mTorr. RF source power may be applied to maintain a plasma between about 1000 watts to about 4500 watts to maintain the plasma inside the etch chamber. A substrate temperature is maintained within a temperature range of between about −50 degrees Celsius and about 100 degrees Celsius, such as between about −20 degrees Celsius to about 40 degrees Celsius. In one embodiment, the second etching process may be performed between about 0.01 seconds and about 100 seconds, such as about 0.3 seconds and about 3 seconds.

Figure 4E:
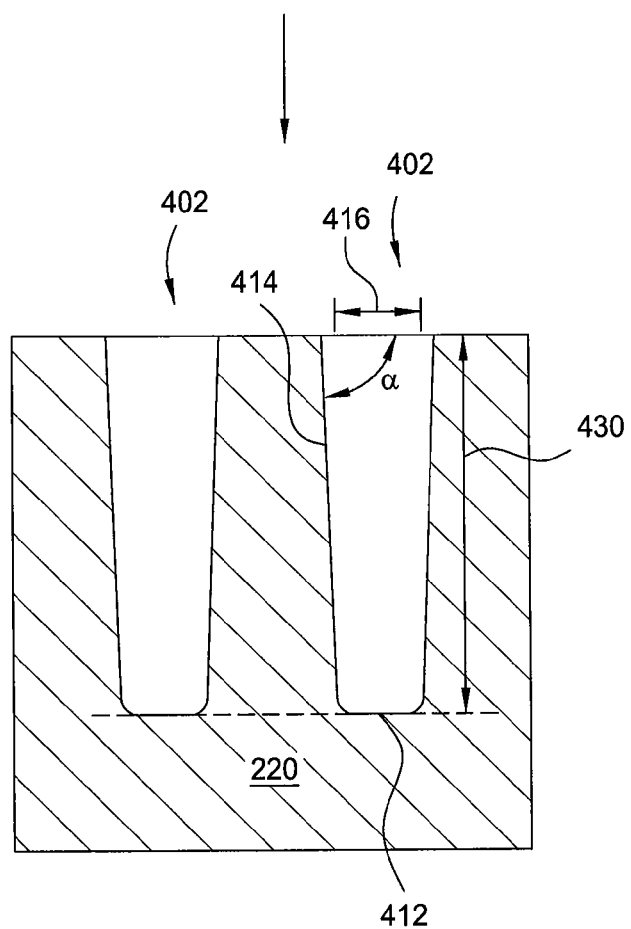

At block 314, after several repeated cycles from block 306 to block 310, as indicated by loop 312, a high aspect ratio of TSVs 402 may be formed on the substrate 220 with a desired depth 430 and taper angle α, as shown in FIG. 4E. In one embodiment, the resultant TSVs 402 may have an aspect ratio (the depth 430 over a width 416 of the via 402) greater than 20, such as between about 2 and about 20. In one embodiment, the width 416 is about between about 5 μm and about 50 μm and the depth 430 is between about 10 μm and about 200 μm.

Additionally, by proper control of the duration and duration ratio of the polymer passivation deposition process at block 306 to the second etching process at block 310 may efficiently tune the taper angle α formed in the resultant TSVs 402. In one embodiment, by performing a relatively longer polymer passivation deposition process at block 306 as compared to a shorter second etching process at block 310, a higher taper angle α may be obtained. In contrast, by performing a relatively shorter polymer passivation deposition process at block 306 as compared to a longer second etching process at block 310, a lower taper angle α may be obtained. In one embodiment, the ratio of the duration of the polymer passivation deposition process at block 306 to the duration of the second etching process at block 310 may be controlled at between 0.3 and about 2 to obtain a taper angle α of the TSVs between about 85 degrees to about 90 degrees. The taper angle α of the TSVs may be tuned and varied to meet different device requirement. In one embodiment, the taper angle α of the TSVs may be controlled at between about 85 degrees to about 90 degrees, such as between about 88 degrees and about 90 degrees, for example between about 89.3 degrees and about 89.5 degrees.

Thus, methods and apparatus for forming high aspect ratio TSVs within a substrate are provided. By using a relatively low process pressure during a polymer passivation deposition process and a relatively high bias power during a depassivation process performed prior to an etching process, a good sidewall profile and via depth control may be obtained. Furthermore, cy alternating the duration performed in the polymer passivation deposition process and the plasma etching process during the TSVs formation process, a desired taper angle may be tuned and obtained to meet different device design requirements.

While the foregoing is directed to embodiments of the present disclosure, other and further embodiments of the disclosure may be devised without departing from the basic scope thereof, and the scope thereof is determined by the claims that follow.

The invention claimed is:

1. A method for forming through-silicon vias in a substrate, comprising:
   (a) performing a first etching process on a substrate in a processing chamber to form partial vias in the substrate;
   (b) forming a polymer passivation layer on sidewalls and a bottom of the vias formed in the substrate using a polymer passivation gas mixture supplied into the processing chamber while maintaining a process pressure at less than 200 mTorr for a first predetermined time period;

(c) preferentially removing a portion of the polymer passivation layer formed on the bottom of the vias relative to the polymer layer formed on the sidewalls of the via using a depassivation gas mixture supplied into the processing chamber;

(d) performing a second etching process to continue etching the bottom of the vias with polymer passivation layer present on the sidewalls of the vias for a second predetermined time period; and (e) repeating (b)-(d) until a desired depth of the vias is reached.

2. The method of claim 1, wherein (b) forming the polymer passivation layer further comprises:
maintaining the process pressure between about 20 mTorr and about 200 mTorr.

3. The method of claim 1, wherein the polymer passivation gas mixture supplied for forming the polymer passivation layer includes at least a $C_4F_8$ gas.

4. The method of claim 1, wherein (c) removing the portion of the polymer passivation layer further comprises:
applying a bias power to the substrate greater than 150 watts.

5. The method of claim 1, wherein (c) removing the portion of the polymer passivation layer further comprises:
applying a bias power to the substrate between about 150 watts and about 350 watts.

6. The method of claim 1, wherein the depassivation gas used to remove the polymer passivation layer formed on the bottom of the vias includes at least a $C_2F_6$ gas.

7. The method of claim 1, wherein a ratio of the first predetermined time period to the second predetermined time period is between about 0.3 and about 2.

8. The method of claim 1, wherein a ratio of the first predetermined time period to the second predetermined time is selected to produce a taper angle formed in the via of 85 to 90 degrees.

9. The method of claim 1, wherein the first gas mixture and the second gas mixture include at least a $SF_6$ gas.

10. The method of claim 1, wherein the substrate is a silicon containing substrate.

11. A method for forming through-silicon vias in a substrate, comprising:
(a) performing a first etching process on a substrate in a processing chamber to partially form vias in the substrate;
(b) performing a polymer passivation deposition process on sidewalls and a bottom of the vias formed in the substrate while maintaining a process pressure at less than 200 mTorr for a first predetermined time period;
(c) performing a depassivation process to remove a portion of the polymer passivation layer from the bottom of the vias while maintaining a bias power to the substrate greater than about 150 watts during the depassivation process;
(d) performing a second etching process to continue etching the bottom of the vias with polymer passivation layer present on the sidewalls of the vias for a second predetermined time period; and
(e) repeating (b)-(d) until the vias reaches a depth of between about 10 μm and about 200 μm.

12. The method of claim 11, wherein a ratio of the first predetermined time period to the second predetermined time period is between about 0.3 and about 2.

13. The method of claim 11, wherein a ratio of the first predetermined time period to the second predetermined time is selected to produce a taper angle formed in the via of 85 to 90 degrees.

14. The method of claim 11, wherein the polymer passivation deposition process is performed for between about 0.01 seconds and about 100 seconds.

15. A method for forming through-silicon vias in a substrate, comprising:
(a) supplying a first etching gas mixture into a processing chamber to partially form vias in a substrate disposed therein, process pressure within the processing chamber maintained above 50 mTorr while partially forming the vias;
(b) supplying a polymer passivation gas mixture into the processing chamber to maintain the process pressure at less than about 200 mTorr until a polymer passivation layer with a desired thickness has formed in the vias;
(c) supplying a depassivation gas mixture into the processing chamber while maintaining a substrate bias power greater than about 150 Watts until the polymer passivation layer formed on the bottom of the vias is removed, the process pressure within the processing chamber maintained between about 50 mTorr and about 150 mTorr while continuing to etch the vias;
(d) supplying a second etching gas mixture into the processing chamber to continue etching the vias through the bottom exposed by the polymer passivation layer until the polymer passivation layer formed on the sidewall of the vias are removed; and
(e) repeating (b)-(d).

16. The method of claim 15, further comprising:
controlling a ratio of process time of (b) to (d) at between about 0.3 and about 2.

17. The method of claim 15, wherein a ratio of the first predetermined time period to the second predetermined time is selected to produce a taper angle formed in the via of 85 to 90 degrees.

* * * * *